US011858064B2

United States Patent
Massey, Jr.

(10) Patent No.: US 11,858,064 B2
(45) Date of Patent: Jan. 2, 2024

(54) PATH PLANNING SYSTEMS AND METHODS FOR ADDITIVE MANUFACTURING

(71) Applicant: ILLINOIS TOOL WORKS INC., Glenview, IL (US)

(72) Inventor: Steven B. Massey, Jr., Appleton, WI (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 16/279,507

(22) Filed: Feb. 19, 2019

(65) Prior Publication Data

US 2020/0262005 A1    Aug. 20, 2020

(51) Int. Cl.
| | |
|---|---|
| *B33Y 50/02* | (2015.01) |
| *G05B 19/418* | (2006.01) |
| *B23K 26/04* | (2014.01) |
| *B23K 26/342* | (2014.01) |
| *G06F 30/00* | (2020.01) |
| *B23K 9/04* | (2006.01) |
| *B23K 9/12* | (2006.01) |
| *B33Y 10/00* | (2015.01) |
| *B33Y 30/00* | (2015.01) |
| *B33Y 40/00* | (2020.01) |

(52) U.S. Cl.
CPC ............ *B23K 26/043* (2013.01); *B23K 9/042* (2013.01); *B23K 9/125* (2013.01); *B23K 26/342* (2015.10); *G05B 19/41865* (2013.01); *G06F 30/00* (2020.01); *B33Y 10/00* (2014.12); *B33Y 30/00* (2014.12); *B33Y 40/00* (2014.12); *B33Y 50/02* (2014.12); *G05B 2219/34418* (2013.01); *G05B 2219/35214* (2013.01)

(58) Field of Classification Search
CPC .... G05B 19/41865; G05B 2219/35214; G05B 2219/34418; G05B 2219/49007; G05B 2219/49023; G05B 19/40937; B23K 31/02; B23K 37/00; Y02P 90/02
See application file for complete search history.

(56) References Cited

U.S. PATENT DOCUMENTS

| | | | |
|---|---|---|---|
| 9,149,885 | B2 | 10/2015 | Waldhoer |
| 9,808,886 | B2 | 11/2017 | Peters |
| 9,815,135 | B2 | 11/2017 | Daniel |
| (Continued) | | | |

FOREIGN PATENT DOCUMENTS

| | | |
|---|---|---|
| CN | 107008996 | 8/2017 |
| CN | 107234239 | 10/2017 |
| (Continued) | | |

OTHER PUBLICATIONS

US 10,035,210 B2, 07/2018, Daniel (withdrawn)
(Continued)

*Primary Examiner* — M. N. Von Buhr
(74) *Attorney, Agent, or Firm* — McAndrews, Held & Malloy, Ltd.

(57) ABSTRACT

Disclosed are systems and methods to plan a path to form a part using an additive manufacturing system. The additive manufacturing system may include one or more additive manufacturing tools. The additive manufacturing tools may include arc welding tools and non-arc welding tools. The system may also manufacture the part based on the planned path.

19 Claims, 5 Drawing Sheets

(56) References Cited

U.S. PATENT DOCUMENTS

| | | | |
|---|---|---|---|
| 9,833,862 B2 | 12/2017 | Denney | |
| 9,839,978 B2 | 12/2017 | Narayanan | |
| 9,937,580 B2 | 4/2018 | Peters | |
| 10,046,419 B2 | 8/2018 | Denney | |
| 10,449,731 B2* | 10/2019 | Deaville | B29C 70/386 |
| 2006/0156978 A1* | 7/2006 | Lipson | A61L 27/20 |
| | | | 118/708 |
| 2013/0098886 A1* | 4/2013 | Rappl | B23K 9/1006 |
| | | | 219/130.5 |
| 2013/0105450 A1 | 5/2013 | Waldhoer | |
| 2014/0008328 A1 | 1/2014 | Enyedy | |
| 2014/0042137 A1* | 2/2014 | Daniel | B23K 9/0953 |
| | | | 219/130.5 |
| 2014/0061169 A1* | 3/2014 | Sammons | B23K 9/1006 |
| | | | 219/109 |
| 2014/0117585 A1* | 5/2014 | Douglas | B29C 48/92 |
| | | | 264/401 |
| 2015/0014885 A1* | 1/2015 | Hofmann | B29C 64/106 |
| | | | 264/294 |
| 2015/0021379 A1 | 1/2015 | Albrecht | |
| 2015/0021815 A1 | 1/2015 | Albrecht | |
| 2015/0108096 A1 | 4/2015 | Daniel | |
| 2015/0209889 A1 | 7/2015 | Peters | |
| 2015/0209905 A1 | 7/2015 | Matthews | |
| 2015/0209906 A1 | 7/2015 | Denney et al. | |
| 2015/0209907 A1 | 7/2015 | Narayanan | |
| 2015/0209908 A1 | 7/2015 | Peters | |
| 2015/0209910 A1 | 7/2015 | Denney | |
| 2015/0209913 A1 | 7/2015 | Denney | |
| 2016/0243638 A1 | 8/2016 | Berube | |
| 2016/0243656 A1 | 8/2016 | Berube | |
| 2016/0271717 A1* | 9/2016 | Knoener | B23K 9/125 |
| 2016/0325501 A1* | 11/2016 | Ready | G05B 15/02 |
| 2017/0008114 A1 | 1/2017 | Langham | |
| 2017/0050254 A1 | 2/2017 | Holverson | |
| 2017/0090462 A1* | 3/2017 | Dave | G01N 21/71 |
| 2017/0145586 A1 | 5/2017 | Xiao | |
| 2017/0173735 A1 | 6/2017 | Hsu | |
| 2017/0204979 A1* | 7/2017 | Yoder | F16K 27/105 |
| 2017/0252847 A1 | 9/2017 | Daniel | |
| 2017/0261965 A1 | 9/2017 | Shiihara | |
| 2018/0021887 A1 | 1/2018 | Liu | |
| 2018/0147669 A1 | 5/2018 | Narayanan | |
| 2018/0200824 A1* | 7/2018 | Rappl | B23K 9/124 |
| 2018/0264590 A1* | 9/2018 | Goldfine | B23K 26/123 |
| 2018/0268562 A1 | 9/2018 | Du | |
| 2018/0319097 A1* | 11/2018 | Narayanan | B23K 9/125 |
| 2018/0354075 A1 | 12/2018 | Liu | |
| 2019/0009462 A1* | 1/2019 | Wilenski | B33Y 50/02 |
| 2019/0154160 A1* | 5/2019 | Yoder | F16K 27/107 |
| 2019/0160594 A1* | 5/2019 | Flamm | B22F 10/00 |
| 2019/0228327 A1* | 7/2019 | Horesh | G06F 30/00 |
| 2019/0248089 A1* | 8/2019 | Busbee | A41C 3/128 |
| 2019/0286384 A1* | 9/2019 | Torrent | G06F 3/1211 |
| 2019/0299286 A1* | 10/2019 | Feldmann | B22F 10/36 |
| 2019/0337094 A1* | 11/2019 | Werner | B29C 64/153 |
| 2019/0351501 A1* | 11/2019 | Vandenberg | B23K 9/1006 |
| 2019/0388968 A1* | 12/2019 | Narayanan | B23K 26/348 |
| 2020/0159186 A1* | 5/2020 | King | B33Y 70/10 |
| 2020/0198246 A1* | 6/2020 | El-Wardany | G05B 19/4099 |
| 2022/0226922 A1* | 7/2022 | Albrecht | B23K 9/23 |

FOREIGN PATENT DOCUMENTS

| | | |
|---|---|---|
| CN | 108796497 | 11/2018 |
| CN | 108994459 | 12/2018 |
| WO | 2015027464 | 3/2015 |
| WO | 2018001454 | 1/2018 |

OTHER PUBLICATIONS

Selection of Welding Process: 3 Considerations | Metallurgy, shared by Shrijit G, Aug. 30, 2017, accessed Jan. 26, 2023, https://www.yourarticlelibrary.com/welding/welding-process/selection-of-welding-process-3-considerations-metallurgy/97799. (Year: 2017).*

European Patent Office Communication, Application No. 1234536785 dated Jul. 13, 2020 (8 pages).

Deja Mariusz et al.: "Feature-based generation of machining process plans for optimised parts manufacture", Journal of Intelligent Manufacturing, vol. 24, No. 4, Mar. 15, 2012 (Mar. 15, 2012), pp. 831-846, XP055867152, New York, ISSN: 0956-5515, DOI: 10.1007/s10845-012-0633-x.

European Patent Office Communication Application No. 20154198.4 dated Dec. 6, 2021.

* cited by examiner

PATH PLANNING SYSTEMS AND METHODS FOR ADDITIVE MANUFACTURING

BACKGROUND

Additive manufacturing is a process that deposits material in a layered fashion to build up a part into a particular geometry. Additive manufacturing systems may include a variety of features, for example a motion system and one or more additive manufacturing tools which may perform one or more additive manufacturing processes. Various features of a part to be manufactured using additive manufacturing may require, or may be most efficiently manufactured, using a certain additive manufacturing process. Thus, there is a need for systems and methods which can plan a path for an additive manufacturing system to manufacture a part based on the part to be manufactured and various features and abilities of the additive manufacturing system.

SUMMARY

The present disclosure relates generally to additive manufacturing systems, and more particularly to systems and methods for planning a path for manufacturing a part using an additive manufacturing system, substantially as illustrated by and described in connection with at least one of the figures, as set forth more completely in the claims.

DRAWINGS

The figures are not necessarily to scale. Where appropriate, similar or identical reference numbers are used to refer to similar or identical components.

DETAILED DESCRIPTION

Figure 1:
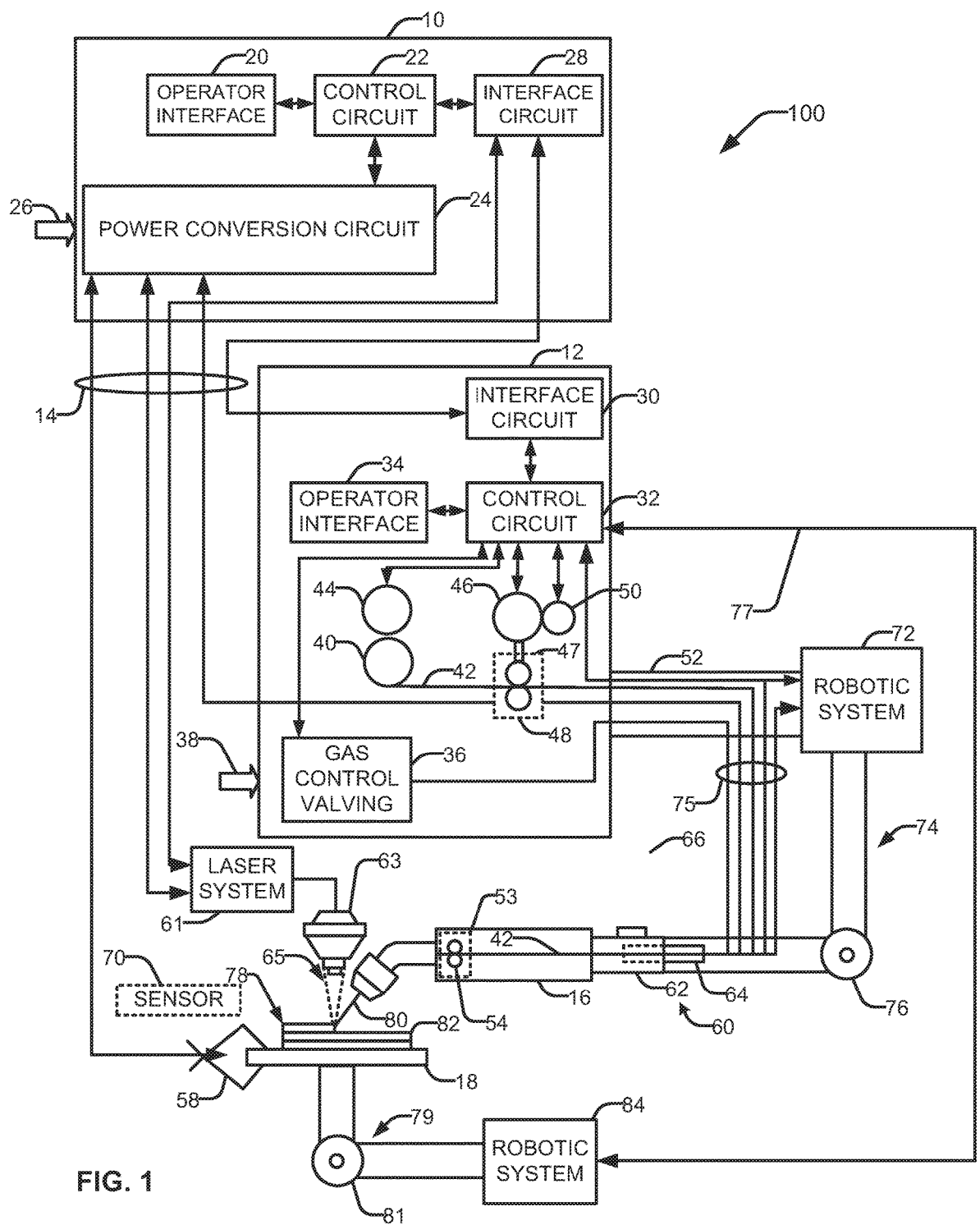
FIG. 1 illustrates an additive manufacturing system employing an arc welding process to create a part, in accordance with aspects of this disclosure.

The present disclosure describes systems and methods for planning a path for forming a part by additive manufacturing techniques as well as controlling an additive manufacturing system to form the part. An additive manufacturing system may employ sensor data and three-dimensional models in conjunction with one or more welding-type processes to build up the part.

Additive manufacturing is any of various processes in which material is joined or solidified under computer control to create a three-dimensional object, with material being added together in a layered fashion. Additive manufacturing systems may employ various welding-type processes, including: arc welding processes including gas metal arc welding ("GMAW") (including reciprocating wire feed GMAW ("RWF-GMAW"), alternating current gas metal arc welding, and pulsed GMAW ("P-GMAW")), gas tungsten arc welding with wire ("GTAW"), plasma arc welding with wire, plasma arc welding with powder, and submerged arc welding with wire or strip electrode; and non-arc welding-type processes such as laser welding with wire, laser welding with powder, and laser cladding. Some additive manufacturing systems may employ a laser system to generate a laser beam focused on a weld puddle, and an arc welding process to provide a material to build up the part. Additive manufacturing processes may also utilize various material forms, for example wire and powder of various geometries and compositions.

Additive manufacturing builds a three-dimensional object from a computer-aided design (CAD) model or Additive Manufacturing File Format (AMF) file, usually by successively adding material (e.g., an electrode wire or) layer by layer.

Conventional systems that employ multiple techniques to create additive manufactured parts may require an operator to determine a path for manufacturing the part. An operator may be required to determine which additive manufacturing process and associated parameters to use for the various features of the part to be manufactured. A system that could receive a three-dimensional model of the part to be manufactured and plan a path for forming the part based on the three-dimensional model, the available additive manufacturing tools and processes, and the motion capabilities of the additive manufacturing system, is therefore desirable.

Disclosed additive manufacturing systems include a plurality of additive manufacturing tools configured to perform a plurality of additive manufacturing processes; a processing circuit; and a machine readable storage device including machine readable instructions which, when executed, cause the processing circuit to: receive a model of a part to be manufactured; receive information indicating the plurality of additive manufacturing processes; determine a sequence to manufacture the part based on the model of the part and the plurality of additive manufacturing processes; and control the plurality of additive manufacturing tools to manufacture the part according to the sequence.

In some example additive manufacturing systems, the sequence includes manufacturing each of a plurality of features of the part to be manufactured via one of the plurality of additive manufacturing processes.

In some example additive manufacturing systems, the plurality of additive manufacturing processes includes at least two of gas metal arc welding, pulsed gas metal arc welding, reciprocating gas metal arc welding, gas tungsten arc welding, submerged arc welding, plasma arc welding, and laser welding.

In some example additive manufacturing systems, the instructions cause the processing circuit to determine a material form and a deposition rate for each of a plurality of features of the part to be manufactured, and the sequence is determined based on the determined material form and deposition rate for each of the plurality of features to be formed via the sequence.

In some example additive manufacturing systems, the sequence includes causing the processing circuit to: control a first tool to perform a first process to manufacture a first feature of the part to be manufactured; and control a second tool to perform a second process to manufacture a second feature of the part to be manufactured.

In some example additive manufacturing systems, the sequence includes causing the processing circuit to: control a first tool to perform a first process to manufacture a first feature of the part to be manufactured using a first material form; and control a second tool to perform a second process to manufacture a second feature of the part to be manufactured using a second material form.

Some example additive manufacturing systems further include a motion system configured to: move at least one of the first part to be manufactured relative to the plurality of additive manufacturing tools; or move the plurality of additive manufacturing tools relative to the first part to be manufactured.

In some example additive manufacturing systems, the instructions further cause the processing circuit to receive information indicating abilities of the motion system, and the sequence is determined in part based on the abilities of the motion system.

In some example additive manufacturing systems, the motion system is configured to adjust a position or orientation of the part to be manufactured.

In some example additive manufacturing systems, the sequence includes causing the processing circuit to: control a first tool to perform a first process to manufacture a first feature of a plurality of features of the part to be manufactured; control the motion system to adjust at least one of the position or the orientation of the part to be manufactured after manufacturing the first feature; and control a second tool to perform a second process to manufacture a second feature of the plurality of features of the part to be manufactured.

In some example additive manufacturing systems, the part to be manufactured is manufactured onto an existing part.

In some example additive manufacturing systems, the instructions further cause the processing circuit to receive information indicating a cost of each of the plurality of additive manufacturing processes, and the sequence is determined in part based on the cost of each of the plurality of additive manufacturing processes.

Disclosed methods of manufacturing a part include: receiving a three-dimensional model of a first part to be manufactured by an additive manufacturing system, the additive manufacturing system including a plurality of additive manufacturing tools configured to perform a plurality of additive manufacturing processes; receiving information indicating the plurality of additive manufacturing processes the plurality of additive manufacturing tools are configured to perform; determining a sequence to manufacture the part based on the three-dimensional model and the plurality of additive manufacturing processes; and manufacturing the first part according to the sequence.

In some example methods of manufacturing a part, the sequence includes manufacturing each of a plurality of features of the first part via one of the available additive manufacturing processes.

Some example methods of manufacturing a part further include: controlling a first tool to perform a first process to manufacture a first feature of a plurality of features of the part to be manufactured and controlling a second tool to perform a second process to manufacture a second feature of the plurality of features of the part to be manufactured.

In some example methods of manufacturing a part, the additive manufacturing system includes a motion system configured to adjust a position or orientation of the part to be manufactured, and the sequence includes: controlling a first tool to perform a first process to manufacture a first feature of a plurality of features of the part to be manufactured; adjusting at least one of the position or the orientation of the part to be manufactured after manufacturing the first feature; and controlling a second tool to perform a second process to manufacture a second feature of the plurality of features of the part to be manufactured.

In some example methods of manufacturing a part, the part to be manufactured is formed onto an existing part.

Some example methods of manufacturing a part further include: receiving information indicating a cost of each of the plurality of additive manufacturing processes, and the sequence is determined in part based on the cost of each of the available additive manufacturing processes.

Disclosed systems for planning a manufacturing process to be performed by an additive manufacturing system include: a processing circuit; and a machine readable storage device including machine readable instructions which, when executed, cause the processing circuit to: receive a three-dimensional model of a first part to be manufactured by the additive manufacturing system; receive information indicating a selection of available additive manufacturing processes of the additive manufacturing system; receive information indicating abilities of a motion system of the additive manufacturing system; and determine a sequence to manufacture the first part based on the three-dimensional model of the part, the abilities of the motion system, and the available additive manufacturing processes.

FIG. 1 illustrates an example arc welding system 100 for performing welding operations to create objects by additive manufacturing techniques. As shown in the arc welding system of FIG. 1, a power supply 10 and a wire feeder 12 are coupled via conductors or conduits 14. In the illustrated example, the power supply 10 is separate from the wire feeder 12, such that the wire feeder may be positioned at some distance from the power supply near a welding location. However, in some examples the wire feeder may be integrated with the power supply 10. In such cases, the conduits 14 would be internal to the system. In examples in which the wire feeder 12 is separate from the power supply 10, terminals are typically provided on the power supply and on the wire feeder 12 to allow the conductors or conduits to be coupled to the systems so as to allow for power and gas to be provided to the wire feeder 12 from the power supply 10, and to allow data to be exchanged between the two devices.

The system is configured to provide wire, power and shielding gas to an additive manufacturing tool or welding torch 16. The tool 16 may be of many different types, and may allow for the feed of a welding wire 42 (e.g., an electrode wire) and gas to a location adjacent to a substrate or platform 18 upon which a part 78 that includes layers 82 is to be formed by the deposition of welding wire 42, which in some examples may be metal droplets 80. A second conductor is run to the welding workpiece so as to complete an electrical circuit between the power supply and the workpiece. A robotic system 84 may adjust the position or the orientation of the substrate or platform 18.

The welding system is configured for data settings to be selected by the operator and/or a welding sequence, such as via an operator interface 20 provided on the power supply 10. The operator interface 20 will typically be incorporated into a front faceplate of the power supply 10, and may allow for selection of settings such as the weld process, the type of wire to be used, voltage and current settings, and so forth. In particular, the system is configured to allow for welding with various steels, aluminums, or other welding wire that is channeled through the tool 16. Further, the system is configured to employ welding wires with a variety of cross-sectional geometries (e.g., circular (including solid and tubular), substantially flat, triangular, etc.). These weld settings are communicated to a control circuit 22 within the power supply. The system may be particularly adapted to implement welding regimes configured for certain electrode types.

Additionally or alternatively, process instructions for additive manufacturing can be provided via a weld sequence program, such as stored on a memory accessible to a processor/control circuit 22 associated with the power supply 10. In such a case, the sequencer can employ stored information (e.g., associated with a desired product configuration and/or process, including historical data), and/or customizable by a user. In some examples, as explained in more detail below, weld sequences may be determined by control circuitry of the system 100 based on the capabilities of the system 100 and the three-dimensional model of the part. The stored information can be used to control operation of the system 100 to facilitate formation of the part 78, such as by controlling a power output from the power supply 10, wire feeder motors 48, 54, robotic system 72, robotic system 84, etc.

The control circuit 22, described in greater detail below, operates to control generation of welding power output that is supplied to the welding wire 42 for carrying out the desired additive manufacturing operation. As illustrated, the control circuit 22 may be adapted to regulate a pulsed metal inert gas ("MIG") welding regime that promotes short circuit transfer of molten metal to the substrate 18 in order to build up multiple layers 82 of the part 78, without adding excessive energy to the part 78 or the welding wire 42. In "short circuit" modes, droplets of molten material form on the welding wire 42 under the influence of heating by the welding arc, and these are periodically transferred to the part 78 by contact or short circuits between the welding wire 42 and droplets 80 and the layers 82.

In this manner, the system and/or the control circuit 22 controls formation of the part 78 by adjusting one or more operational characteristics of the system during the additive manufacturing process. The operational characteristics may include, but are not limited to, wire feeder speed, wire feeder direction, travel speed, power output, process mode, deposition path, deposition sequence, torch angle, etc.

Additionally, a sensor(s) 70 can measure operational parameters associated with operation of the system (e.g., current, voltage, inductance, phase, power, inductance, speed, acceleration, orientation, position, etc.). The sensed operational characteristic (e.g., voltage, current, temperature, shape, speed, etc.) can be provided to the control circuit 22 or other controller (e.g., control circuit 32, a controller associated with the robotic system 72, etc.) to further control the additive manufacturing process.

Power from the power supply is applied to the wire electrode 42, typically by a welding cable 52. Similarly, shielding gas is fed through the wire feeder and the welding cable 52. During welding operations, the welding wire 42 is advanced through a jacket of the welding cable 52 towards the tool 16. Within the tool 16, a second wire feeder motor 53 comprises rollers 54 may be provided with an associated drive roller, which can be regulated to provide the desired wire feed speed and/or direction.

A robotic system 72 can be employed to regulate movement and position of the tool 16 in accordance with the control circuits 22, 32, as well as information from sensor(s) 70, for example. Similarly, a robotic system 84 can be employed to regulate movement and position of the platform 18, in accordance with the control circuits 22, 32, as well as information from sensor(s) 70. In examples, the robotic system 72 and the robotic system 84 may be in communication with the power supply 10, the wire feeder 12 and/or the tool 16 via one or more cables 75 and 77. Thus, power and/or information can be provided and/or exchanged via cable 75 to control the additive manufacturing process. In particular, the robotic system 72 can employ one or more arms 74 having one or more actuators 76 (e.g., servo motors, joints, etc.). In this way, the robotic system 72 can command fine control of the attached tool 16 in six degrees of freedom during the welding operation, including travel speed, tool location, distance from the part 78, etc. The robotic system 72 may include one or more sensors to sense operational characteristics, which can be communicated with the control circuits 22, 32 to further facilitate formation of the part 78. Similarly, the robotic system 84 can employ one or more arms 79 having one or more actuators 81 (e.g., servo motors, joints, etc.). In this way, the robotic system 84 can command fine control of the platform 18 in six degrees of freedom during the additive manufacturing process.

In some examples, the control circuits 22, 32 may provide a signal to the wire feeder 12, the power supply 10, the robotic system 72, and or the robotic system 84 to enable the additive manufacturing process to be started and stopped in accordance with a particular part design. That is, upon initiation of the process, gas flow may begin, wire may advance, and power may be applied to the welding cable 52 and through the tool 16 to the advancing welding wire 42. A workpiece cable and clamp 58 allow for closing an electrical circuit from the power supply through the welding torch, the electrode (wire), and the part 78 for maintaining the welding arc during the operation.

The present arc welding system allows for control of successive voltage and/or current levels and/or pulse durations based on previous current and duration measurements so as to control the promotion, occurrence, duration, and interruption of short circuit events between the welding wire electrode and the advancing weld puddle. In particular, current peaks in waveforms are regulated based on one or more preceding short circuit events, or aspects of the short circuit events, such as its duration.

The control circuit 22 is coupled to power conversion circuit 24. This power conversion circuit 24 is adapted to create the output power, such as pulsed waveforms applied to the welding wire 42 at the tool 16. Various power conversion circuits may be employed, including choppers, boost circuitry, buck circuitry, inverters, converters, and so forth. The configuration of such circuitry may be of types generally known in the art in and of itself. The power conversion circuit 24 is coupled to a source of electrical power as indicated by arrow 26. The power applied to the power conversion circuit 24 may originate in the power grid, although other sources of power may also be used, such as power generated by an engine-driven generator, batteries, fuel cells or other alternative sources. The power supply illustrated in FIG. 1 may also include an interface circuit 28 configured to allow the control circuit 22 to exchange signals with the wire feeder 12.

The wire feeder 12 includes a complimentary interface circuit 30 that is coupled to the interface circuit 28. In some examples, multi-pin interfaces may be provided on both components and a multi-conductor cable run between the interface circuit to allow for such information as wire feed speeds, processes, selected currents, voltages or power levels, and so forth to be set on either the power supply 10, the wire feeder 12, or both.

The wire feeder 12 also includes control circuit 32 coupled to the interface circuit 30. As described below, the control circuit 32 allows for wire feed speeds to be controlled in accordance with operator selections or stored or determined sequence instructions, and permits these settings to be fed back to the power supply via the interface circuit. The control circuit 32 is coupled to an operator interface 34 on the wire feeder that allows selection of one or more welding parameters, particularly wire feed speed. The operator interface may also allow for selection of such weld parameters as the process, the type of wire utilized, current, voltage or power settings, and so forth. The control circuit 32 may also be coupled to gas control valving 36 which regulates the flow of shielding gas to the torch. In general, such gas is provided at the time of welding, and may be turned on immediately preceding the weld and for a short time following the weld. The gas applied to the gas control valving 36 may be provided in the form of pressurized bottles, as represented by reference numeral 38.

The wire feeder 12 includes components for feeding wire to the welding tool 16 and thereby to the welding application, under the control of control circuit 32. For example, one or more spools of welding wire 40 are housed in the wire feeder. Welding wire 42 is unspooled from the spools and is progressively fed to the tool 16. The spool may be associated with a clutch 44 that disengages the spool when wire is to be fed to the tool. The clutch 44 may also be regulated to maintain a minimum friction level to avoid free spinning of the spool 40. The first wire feeder motor 46 may be provided within a housing 48 that engages with wire feed rollers 47 to push wire from the wire feeder 12 towards the tool 16.

In the example of FIG. 1, a moveable buffer 60 can include a first portion 62 and a second portion 64, where at least one of the first and second portions are configured to move relative the other portion in response to a change in the amount of welding wire 42 between a first wire feeder motor 46 and a second wire feeder motor 53. A sensor 66 (e.g., one or more sensors) is configured to sense relative movement or displacement between the first and second portions and provide sensor data to control circuit (e.g., control circuit 22, 32) to adjust a speed and/or direction of the welding wire 42 in response.

In practice, at least one of the rollers 47 is mechanically coupled to the motor and is rotated by the motor to drive the wire from the wire feeder, while the mating roller is biased towards the wire to maintain good contact between the two rollers and the wire. Some systems may include multiple rollers of this type. A tachometer 50 or other sensor may be provided for detecting the speed of the first wire feeder motor 46, the rollers 47, or any other associated component so as to provide an indication of the actual wire feed speed. Signals from the tachometer are fed back to the control circuit 32, such as for continued or periodic monitoring, calibration, etc. In some examples, the system includes a wire spool motor for rotating the wire feeding device, which can be similarly adjusted to increase or decrease the amount of wire between wire feeder motors.

Other system arrangements and input schemes may also be implemented. For example, the welding wire may be fed from a bulk storage container (e.g., a drum) or from one or more spools outside of the wire feeder. Similarly, the wire may be fed from a "spool gun," in which the spool is mounted on or near the welding torch. As noted herein, the wire feed speed settings may be input via the operator input 34 on the wire feeder or on the operator interface 20 of the power supply, or both. In systems having wire feed speed adjustments on the welding torch, this may be the input used for the setting.

As illustrated in FIG. 1, in some examples, the system 100 may employ a laser to add heat to facilitate melting of a material (e.g., electrode wire 42) in the weld puddle to build up a layered part as disclosed with respect to the systems and methods provided herein. As shown, a laser system 61 is provided, connected to the power supply 10 to supply power from the power conversion circuit 24 and send and receive information to and from the control circuit 22. The laser system 61 controls a laser generator 63 to generate a laser beam 65 for application to one or more layers 82 of the part 78. The laser system 61 is configured to cooperate with the welding tool 16 to and control system 72 to ensure a desired stability is present in an arc, for example, in a GMAW process using a Titanium wire. The laser system 61 may communicate with the control circuit 22 via the interface circuit 28.

Although described with respect to an arc welding-type system, the disclosed system may be implemented in conjunction with a variety of technologies to conduct additive manufacturing processes. In one example, additive manufacturing may employ a laser without the use of a welding arc to melt a material to build up a layered part in a manner similar to the systems and methods disclosed herein.

Although described with respect to creating a new part, in some examples, the system 100 may manufacture a part onto an existing part. For example, a blade of a propeller may be manufactured onto an existing propeller hub via the system 100.

Figure 2:
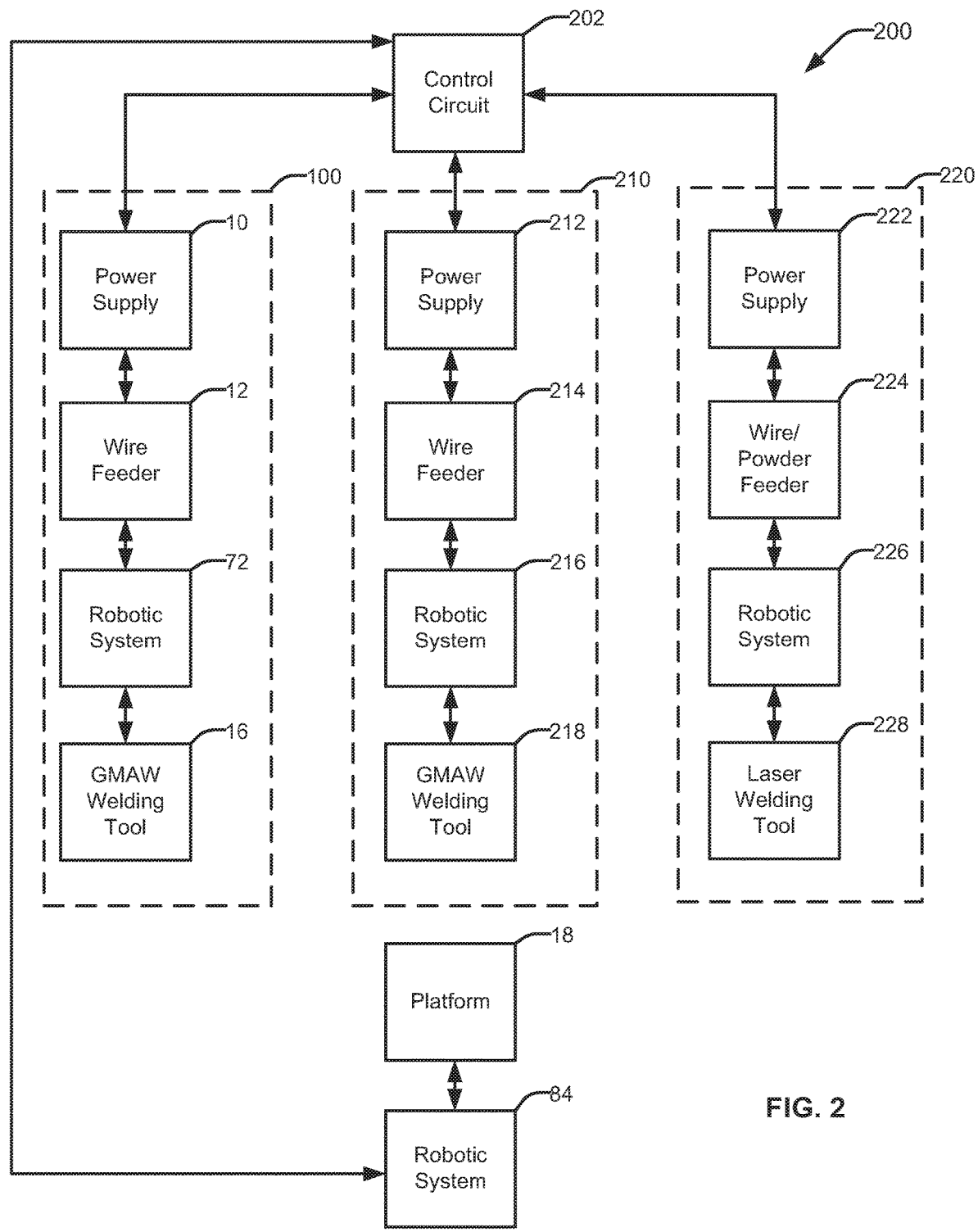
FIG. 2 illustrates a block diagram of an additive manufacturing system in accordance with aspects of this disclosure.

FIG. 2 illustrates a block diagram of an example additive manufacturing system 200 including a plurality of additive manufacturing tools. For example, one of the additive manufacturing tools is the arc welding system 100 of FIG. 1. The additive manufacturing system 200 also includes a second arc welding system 210, which includes a power supply 212, a wire feeder 214, a robotic system 216, and a welding-type tool 218. As illustrated, the welding-type tool 16 of the first additive manufacturing system 100 may be a GMAW type welding tool, and the welding-type tool 218 of the second additive manufacturing system may be a second GMAW type welding tool. The first GMAW type welding tool 16 may be configured to perform a RWF-GMAW type process, and the second GMAW type welding tool 218 may be configured to perform a P-GMAW type welding process. Although described with respect to FIGS. 1 and 2 as GMAW type welding tools, welding tools 16 and 218 can be any type of welding-type tool to perform any type of welding-type process.

The additive manufacturing system 200 includes a third welding-type system 220. The third welding-type system 220 includes a power supply 222, a wire feeder and/or a powder feeder 224, a robotic system 226, and a welding-type tool 228. The welding-type tool 228 may be a laser welding-type tool. The additive manufacturing system 200 also includes a platform 18 for holding a part to be manufactured and a robotic system 84 for adjusting the position and or orientation of the platform 18, and therefore the part being manufactured.

Although illustrated as separate power supplies 10, 212, and 222, in some examples, the welding-type systems 100, 210, and 220 may share a single power supply. Likewise, in some examples, two of the welding-type systems 100, 210, and or 220 may share a single power supply. Although illustrated as three welding-type systems 100, 210, and 220, in some examples the additive manufacturing systems may include more or less additive manufacturing type systems and/or tools. In some examples, additive manufacturing systems may also include plastic deposition tools. Some additive manufacturing systems may include various types of other arc welding and/or non-arc welding-type tools.

Although illustrated as separate robotic systems 72, 216, 226, and 84, a given robotic system 72, 216, 226, or 84 could be shared with one or more processes and/or tools (16, 218, 228, 18). For example, a robotic system (72, 216, 226, or 84) may implement a tool changing scheme in which one robotic system can be used with multiple tools 16, 218, and/or 228. In some examples, two or more robotic systems 72, 216, 226, or 84 share hardware.

A control circuit 202 plans and controls the operation of the additive manufacturing system 200. The control circuit 202 may be one or both of the control circuits 22, 32, configured to function in a system of the type illustrated in FIG. 1. The control circuit 202 may also be or include a control circuit of the power supplies 212, 222, or the wire feeders 214 or 224. The control circuit 202 may also be located at an external computing device, for example, the control circuit 202 may be an application on an external computing device (or a cloud computing device). The control circuit 202 has data connectivity to each of the welding-type systems, 100, 210, and 220 of the additive manufacturing system 200 as well as the robotic system 84.

As explained in more detail below, the control circuit 202 may receive information about the manufacturing capabilities of each of the welding systems 100, 210, and 220 of the additive manufacturing system 200, the abilities of the robotic system 84, as well as a three-dimensional model of a part to be manufactured. The three-dimensional model may include information regarding conditions to form each feature, for example the material that each feature should be made from. Information about the manufacturing capabilities of each of the welding systems 100, 210, and 220 may include a deposition rate, a material form used, a cost to use the system, and/or level of precision. Based on information from the three-dimensional model, i.e., the geometry and material for each feature of the part to be manufactured, and the abilities of the additive manufacturing system, the control circuit 202 then plans a sequence of actions to manufacture the part using the welding-type systems 100, 210, 220 of the additive manufacturing system 200. The control circuit 202 may then command the additive manufacturing system 200 to manufacture the part via the planned sequence of actions.

Figure 3:
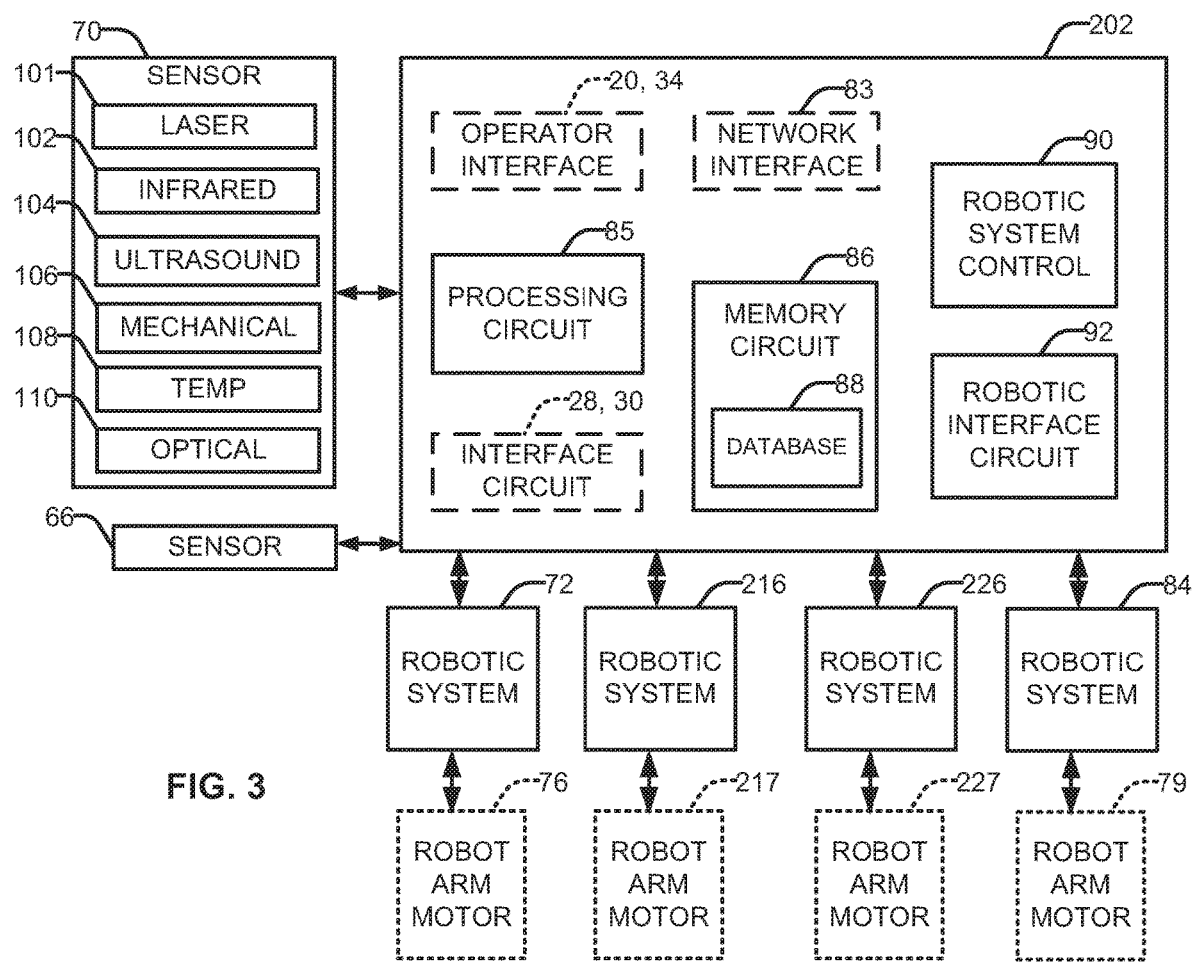
FIG. 3 is a graphical representation of example control circuit components for an additive manufacturing system of the type shown in FIGS. 1 and 2, in accordance with aspects of this disclosure.

FIG. 3 illustrates example control circuit 202 of FIG. 2, such as one or both of control circuits 22 or 32 of FIG. 1. The control circuit 202 is configured to function in an additive manufacturing system 200 of the type illustrated in FIG. 2. The overall circuitry may include the operator interfaces 20 and 34 and/or interface circuits 28 and 30. For example, the various interfaces can provide communication of operational parameters, including user input and networked information via network interface 83, as well as information from downstream components such as a wire feeder, a welding torch/tool, and various sensors and/or actuators.

The control circuit 202 includes a processing circuit 85 which itself may include one or more application-specific or general purpose processors. The processing circuit 85 may be further configured to carry out welding sequences such as corresponding to formation of a particular additive manufacturing part. The processing circuit 85 can receive information regarding the part from a database 88 stored in a memory circuit 86 (e.g., a three-dimensional model of the part), and/or receive the information from a networked computer and/or a user input. Based on the information, the processing circuit 85 can plan, control and/or coordinate actions of the system components by making computations for implementation of an additive manufacturing process.

The various models and inputs can be correlated based on a number of variables of the additive manufacturing process. For example, geometric features of the three-dimensional model may correspond to a point in time and/or space associated with the process and/or part. For instance, a first or base layer of the part may correspond with an earlier time than a later applied layer. The welding sequence can also be synced to the models, to ensure that the welding operation is adjusted to correspond to the requirements of the models.

In an example, the processing circuit 85 may determine the parameters to manufacture a feature or region of a part based on the three-dimensional model of the part. Based on the information from the three-dimensional model of the part associated with the region, the processing circuit 85 may determine which of the additive manufacturing tools 100, 210, or 220, to use, and may adjust an operational characteristic of one or more components of the system (e.g., the power supply 10, 212, 222, the wire feeder 12, 214, 224, the robotic system 72, 216, 226, 84, etc.) based on the information. In this manner, the system controls formation and application of each feature of the part, including the welding-type system (100, 210, 220) and application tool (16, 218, 228), the location of the feature, the amount of power and/or heat associated with the application, speed and direction of the application tool (16, 218, 228), wire feed speed and/or direction, and the position and/or orientation of the platform 18 holding the part.

In some examples, the sensor 70 includes a laser sensor 101 configured to scan the part periodically or continuously during the additive manufacturing process. This scan can be fed back to the processing circuit 85 to compare with the three-dimensional model, to either ensure that the part being formed conforms to the three-dimensional model, and/or to identify variations. Based on the comparison, the processing circuit 85 can adjust one or more operational characteristics of the additive manufacturing system 200 to facilitate formation of the part.

Additionally or alternatively, sensor 70 may include an infrared sensor 102, an ultrasound sensor 104, a mechanical sensor 106, or a thermal sensor 108, an optical sensor 110, to name but a few. Similarly, sensor data from the various sensors can be fed back to the processing circuit 85 for analysis and control of operational characteristics. By coordinating control of the various systems, the part may include finer detail with fewer negative effects associated with conventional metal deposition techniques.

The control circuit 202 controls the various robotic systems 72, 216, 226, 84 of the additive manufacturing system 200. The control circuit 202, which may include a robotic system control 90 and/or robotic interface circuit 92, which can be integrated with one or more components of the circuitry, such as control circuits 22, 32. The robotic system control 90 or robotic interface circuit is in communication with the robotic systems 72, 216, 226, 84 and the processing circuit 85, as well as the memory circuit 86. In some examples, two or more welding-type tools and/or processes share a single robotic system (72, 216, 226, or 84) and therefore may share a robotic motor arm, (76, 217, 227, 79), for example via a tool changing scheme. The robotic control system 90 is configured to control operation of the robotic arm motors 76, 217, 227, 79. In this way, the location and/or orientation of the tools 16, 218, 228 as well as the position and/or orientation of the platform 18 are controlled in coordination with data provided by sensors, models, inputs, etc. As a result, geometric features of the part are formed by control of multiple variables that contribute to creation of the part.

Additionally or alternatively, one or more of the interfaces (e.g., interface circuits 28, 30; operator interfaces 20, 34) can provide information corresponding to operational parameters of the system. In this example, operational parameter information can be provided by one or more of the wire feeder motors, such as current draw, voltage, power, inductance, wire feed speed, wire feed acceleration, wire feeder motor angle, torque, position, etc., which can be analyzed by the processing circuit 85 to indirectly determine one or more operational characteristics. This process can be implemented in conjunction with the sensors 70 and/or 66 or without to achieve a similar result.

In some examples, the processing circuit 85 includes a timer, a speed sensor, or other sensor that may provide information regarding the additive manufacturing process(es), such as the amount of wire consumed, an estimate of the anticipated progress for the manufacturing process, etc. Additionally or alternatively, the control circuit 202 can be configured to monitor and/or adjust a power output characteristic (e.g., current, voltage, power, phase, etc.) associated with the power supplies 10, 212, 222.

The processing circuit 85 is further configured to control the laser system 61 and laser generator 63. The processing circuit 85 provides control signals to the laser system 61 to adjust in response to information corresponding to an amount of wire between the two wire feeder motors. In particular, the sensors 70 can monitor one or more characteristics of the laser system, the arc welding tool 16, the power supply output, and/or the part 78 (e.g., the weld puddle size, shape, temperature, location of the electrode wire and/or the cathode spot on the weld puddle, etc.), and provide data to the processing circuit 85 for analysis and determination.

The processing circuit 85 will also be associated with memory circuitry 86 which may consist of one or more types of permanent and temporary data storage, such as for providing the welding sequences implemented, storing the three-dimensional models, storing operational characteristics, storing weld settings, storing error logs, etc. The adjustment of the operational characteristics can be made by reference and/or comparison to historical data from preceding additive manufacturing operations, which can also be stored on memory circuit 86. For instance, adjustment may be made on the basis of stored data based on an historical analysis of a similar additive manufacturing operation. The historical data can correspond to, for example, operational parameters, other sensor data, a user input, as well as data related to trend analysis, threshold values, profiles associated with a particular mode of operation, etc., and can be stored in a comparison chart, list, library, etc., accessible to the processing circuit 85. Such an analysis can be performed via one or more machine learning and/or artificial intelligence techniques to inform and/or update the sequence determination.

Figure 4:
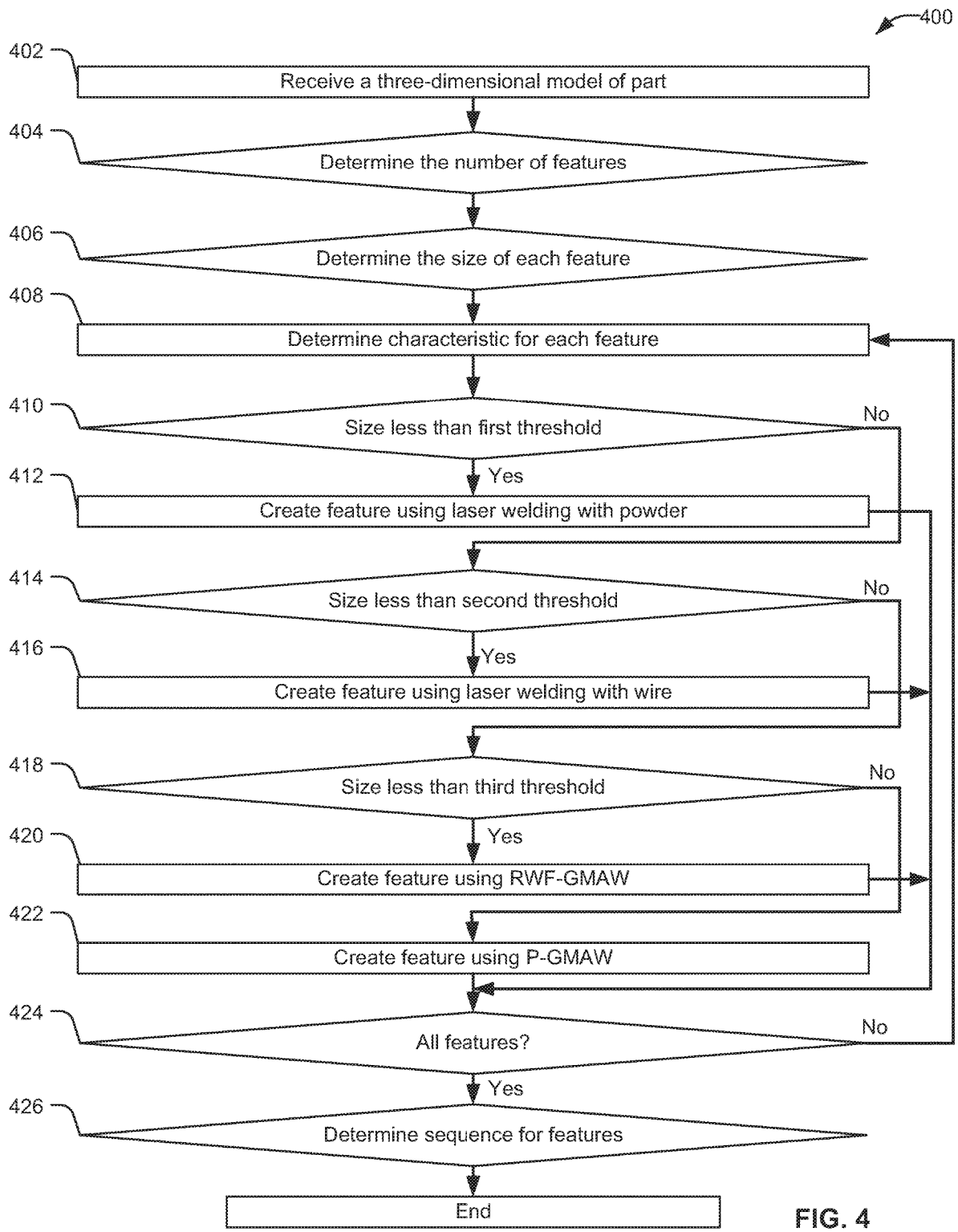
FIG. 4 illustrates a method planning a sequence for forming a part using an additive manufacturing system employing a plurality of additive manufacturing tools, in accordance with aspects of this disclosure.

FIG. 4 illustrates a method 400 of planning a sequence for forming a part using an additive manufacturing system including multiple welding-type systems, for example, the systems described with respect to FIGS. 1-3.

In block 402, the control circuit 202 receives a three-dimensional model of a part to be manufactured. The three-dimensional model may include information regarding the overall geometry of the part to be manufactured, including the geometries and materials of the various features of the part. At block 402, the control circuit 202 may also receive information regarding the abilities of the additive manufacturing system, for example the available welding-type systems and available welding-type processes.

At block 404, the control circuit 202 determines the number of features that make up the part based on the three-dimensional model. In some examples, the three-dimensional model may have labeled features or layers which the control circuit 202 may use to determine the number of features. In some examples, the control circuit 202 may perform image processing (for example, edge detection) to determine each feature of the part to be manufactured. At block 406, the control circuit 202 determines the geometric size of each feature. The geometric size may correspond to a volume of the feature, or a length, height, or width of the feature. In some examples, the geometric size may correspond to the smallest of the length, width, or height of the feature in order to determine the level of precision required to manufacture the feature of the part. At block 408, the control circuit 202 initiates a loop to determine characteristics of each feature for determining the additive manufacturing tool and/or material form to use to manufacture each feature. The loop includes blocks 410-426.

At block 410, the control circuit 202 compares the determined size of the feature to a first threshold. For example, the first threshold may be 3 millimeters. If the size of the feature is less than the first threshold (block 410), then at block 412 the control circuit 202 determines that the feature will be formed using laser welding with powder. The control circuit 202 then checks at block 424 whether each feature of the part to be manufactured has been assigned an additive manufacturing tool and process that will be used to form the feature. If each feature has not been assigned an additive manufacturing tool and process that will be used to form the feature (block 424), then the control circuit 202 returns to block 408. If each feature has been assigned an additive manufacturing tool and process that will be used to form the feature (block 424), then the control circuit 202 proceeds to block 426.

At block 410, if the control circuit 202 determines that the geometric size of the feature is greater than the first threshold, then at block 414 the control circuit 202 compares the geometric size of the feature to a second threshold. For example, the second threshold may be 6 millimeters. If the geometric size is less than the second threshold (block 414), then at block 416 the control circuit 202 determines that the feature will be formed using laser welding with wire. The control circuit 202 then proceeds to block 424. If the control circuit 202 determines that the geometric size of the feature is greater than the second threshold (block 414), then the control circuit 202 compares the geometric size of the feature to a third threshold at block 418. For example, the third threshold may be 10 millimeters. If the control circuit 202 determines that the geometric size of the feature is less than the third threshold (block 418), then at block 420 the control circuit 202 determines that the feature will be formed using RWF-GMAW. The control circuit 202 then proceeds to block 424. If the control circuit 202 determines that the geometric size of the feature is not less than the third threshold, then at block 422 the control circuit 202 determines that the feature will be formed using P-GMAW. The control circuit 202 then proceeds to block 424.

At block 424, if each feature has not been assigned an additive manufacturing tool and process that will be used to form the feature, then the control circuit 202 returns to block 408. If each feature has been assigned an additive manufacturing tool and process that will be used to form the feature (block 424), then the control circuit 202 proceeds to block 426.

At block 426, the control circuit 202 determines a sequence to manufacture the part based on geometric location of the feature on the part, the additive manufacturing tool and process assigned to each feature, the overall geometry of the part, a desired deposition rate and material form with which to manufacture the feature, and the robotic systems of the additive manufacturing system. The control circuit 202 may also select a sequence to minimize the time to manufacture the part and/or the cost to manufacture the part. The control circuit 202 selects a sequence for manufacturing the features that is physically possible. For example, features on the main build axis may be formed before periphery features such that the periphery features are physically supported by the main build axis. As another example, interior features of a part are formed before an exterior encasing the interior is closed. For example a channel within a cylinder would be formed before the cylinder is closed and it would no longer be possible to form the channel.

After determining the sequence for manufacturing the part using the additive manufacturing system, the control circuit 202 may control the additive manufacturing system to manufacture the part using the determined sequence.

Figure 5:
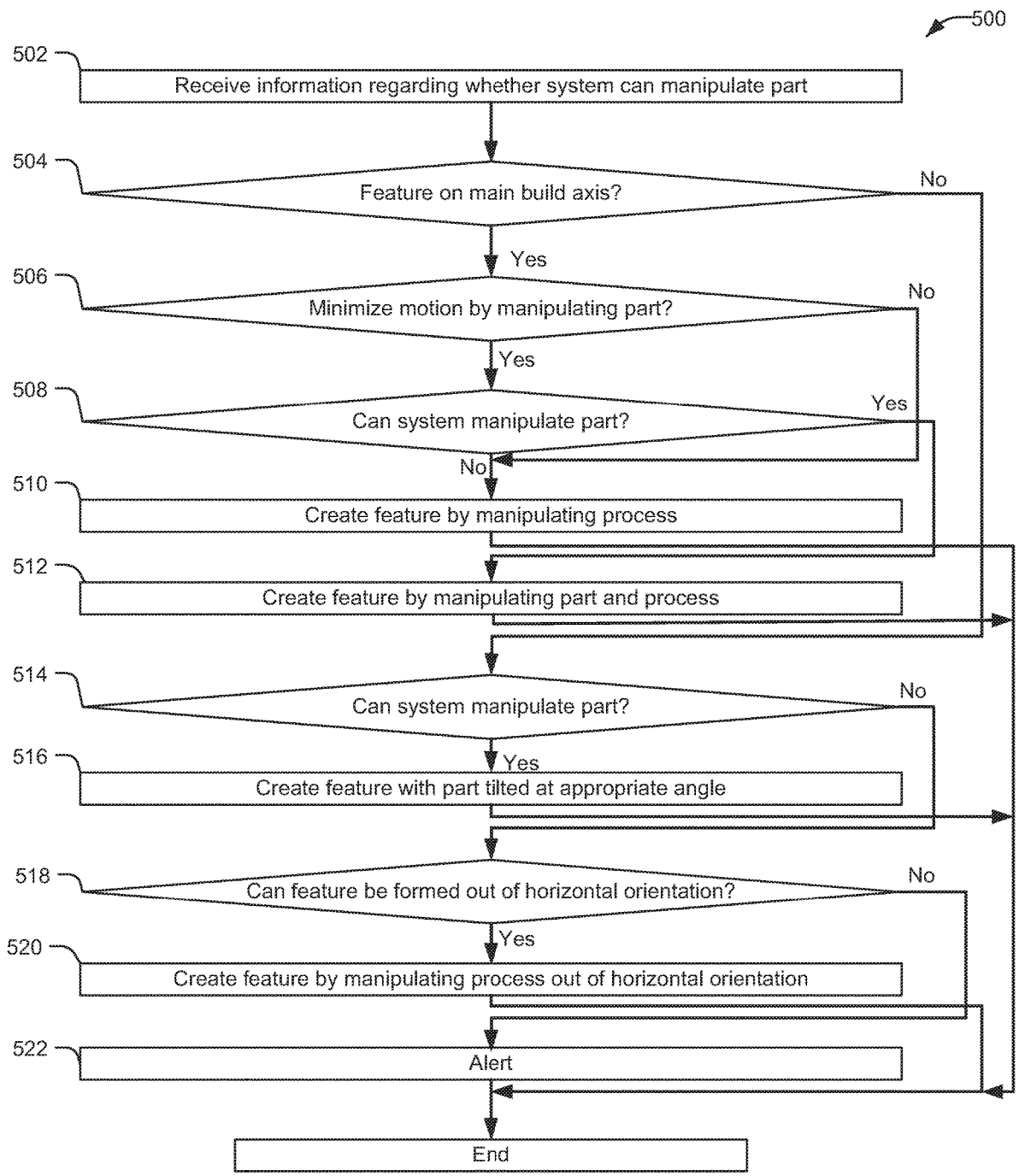
FIG. 5 illustrates a method for planning a path for forming a feature of a part to be manufactured using an additive manufacturing system.

FIG. 5 illustrates a method 500 of planning a path for forming a feature of a part using an additive manufacturing system including multiple welding-type systems, for example, the systems described with respect to FIGS. 1-3. Once the control circuit 202 has determined which welding-type process a feature will be formed by, for example via method 400 of FIG. 4, method 500 of FIG. 5 may be used by the control circuit 202 to plan the path for forming each feature.

At block 502, the control circuit 202 receives information regarding whether the additive manufacturing system can manipulate the part being manufactured. For example, the control circuit 202 determines whether a motion system of the additive manufacturing system 200 includes a robotic system 84 capable of manipulating the position and/orientation of the part. At block 504, the control circuit 202 determines if the feature is located on the main build axis of the part to be manufactured. If the control circuit 202 determines that the feature is on the main build axis (block 504), then the control circuit 202 proceeds to block 506. If the control circuit 202 determines that the feature is not on the main build axis (block 504), then the control circuit 202 proceeds to block 514.

At block 506, the control circuit 202 determines whether motion of the welding-type tool performing the welding-type process could be minimized by also manipulating the part. If motion of the welding-type tool performing the welding-type process could be minimized by also manipulating the part (block 506), then the control circuit 202 proceeds to block 508. If motion of the welding-type tool performing the welding-type process cannot be minimized by also manipulating the part (block 506), then the control circuit 202 proceeds to block 510.

At block 508, the control circuit 202 determines whether the additive manufacturing system is capable of manipulating the part, based on the information received in block 502. If the manufacturing system is not capable of manipulating the part (block 508), then the control circuit 202 proceeds to block 510. If the manufacturing system is capable of manipulating the part (block 508), then at block 512 the control circuit 202 determines a path to create the feature by manipulating the position and/or orientation of both the part and the welding-type tool performing the welding-type process. At block 510, the control circuit 202 determines a path to create the feature by manipulating the position and/or orientation of the welding-type tool performing the welding-type process.

At block 514 (after determining at block 504 that the feature is not on the main build axis), the control circuit 202 determines whether the additive manufacturing system is capable of manipulating the part, based on the information received in block 502. If the manufacturing system is not capable of manipulating the part (block 514), then the control circuit 202 proceeds to block 518. If the manufacturing system is capable of manipulating the part (block 514), then at block 516, the control circuit 202 determines a path to create the feature by manipulating the position and/or orientation of both the part and the welding-type tool performing the welding-type process. For example, the control circuit 202 determines a path to create the feature with the part at an appropriate angle to create the feature.

At block 518 (after determining at block 514 that the additive manufacturing system is not capable of manipulating the part), the control circuit 202 determines whether the feature can be created with the part at a flat or horizontal orientation. If the feature can be formed out of a horizontal orientation (block 518), then at block 520, the control circuit 202 determines a path to create the feature at a horizontal orientation by manipulating the position and/or orientation of the welding-type tool performing the welding-type process.

If the feature cannot be formed at a horizontal orientation (block 518), then at block 522 the control circuit 202 determines that the additive manufacturing system 200 is not capable of creating the feature, and may signal an alert to an operator. In some examples, an operator may physically manipulate the orientation and/or position of the part in order to manufacture the feature of the part in response to the alert.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y". As another example, "x, y, and/or z" means any element of the seven-element set $\{(x), (y), (z), (x, y), (x, z), (y, z), (x, y, z)\}$. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

As used herein, the term "controller" or "control circuit" includes digital and/or analog circuit, discrete or integrated circuit, microprocessors, DSPs, FPGAs, etc., and/or software, hardware and firmware, located on one or more boards, used to control all or part of a welding-type system or a device such as a power supply, power source, engine or generator.

As used herein, the term "periodic" and/or "cyclical" welding process and/or output includes welding output that may be characterized as a series of periods and/or cycles, wherein each cycle may be the same, similar or different.

As used herein, the term "wire feeder" includes the motor or mechanism that drives the wire, the mounting for the wire, and controls related thereto, and associated hardware and software.

Welding-type system, as used herein, includes any device capable of supplying power suitable for welding, plasma cutting, induction heating, CAC-A and/or hot wire welding/preheating (including laser welding and laser cladding), including inverters, converters, choppers, resonant power supplies, quasi-resonant power supplies, etc., as well as control circuitry and other ancillary circuitry associated therewith.

As used herein, the term "welding-type power" refers to power suitable for welding, plasma cutting, induction heating, CAC-A and/or hot wire welding/preheating (including laser welding and laser cladding). As used herein, the term "welding-type power supply" refers to any device capable of, when power is applied thereto, supplying welding, plasma cutting, induction heating, CAC-A and/or hot wire welding/preheating (including laser welding and laser cladding) power, including but not limited to inverters, converters, resonant power supplies, quasi-resonant power supplies, and the like, as well as control circuit and other ancillary circuit associated therewith.

As used herein, the term "pulse welding" includes welding with output power that is generally pulsed, at a controllable frequency, between a greater peak and a lesser background, and pulse welding is performed in an arc state.

As used herein, the term "periodic" and/or "cyclical" welding process and/or output includes welding output that may be characterized as a series of periods and/or cycles, wherein each cycle may be the same, similar or different. As used herein, the term "energy storage device" is any device that stores energy, such as, for example, a battery, a supercapacitor, etc.

As used herein, the term "memory" includes volatile and non-volatile memory, and can be arrays, databases, lists, etc.

As used herein, the term "torch" or "welding-type tool" can include a hand-held or robotic welding torch, gun, or other device used to create the welding arc.

As used herein, the term "welding mode" or "welding operation" is the type of process or output used, such as CC, CV, pulse, MIG, TIG, spray, short circuit, etc.

As used herein, the term "boost converter" is a converter used in a circuit that boosts a voltage. For example, a boost converter can be a type of step-up converter, such as a DC-to-DC power converter that steps up voltage while stepping down current from its input (e.g., from the energy storage device) to its output (e.g., a load and/or attached power bus). It is a type of switched mode power supply.

As used herein, the term "buck converter" (e.g., a step-down converter) refers to a power converter which steps down voltage (e.g., while stepping up current) from its input to its output.

The present methods and systems may be realized in hardware, software, and/or a combination of hardware and software. Example implementations include an application specific integrated circuit and/or a programmable control circuit.

While the present method and/or system has been described with reference to certain implementations, it will be understood by those skilled in the art that various changes may be made and equivalents may be substituted without departing from the scope of the present method and/or system. For example, block and/or components of disclosed examples may be combined, divided, re-arranged, and/or otherwise modified. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

The invention claimed is:

1. An additive manufacturing system, comprising:
a plurality of additive manufacturing tools configured to perform a plurality of additive manufacturing processes;
a processing circuit; and
a machine readable storage device comprising machine readable instructions which, when executed, cause the processing circuit to:
receive a model of a part to be manufactured;
receive information indicating the plurality of additive manufacturing processes;
determine one or more material forms to be added to the part, and a deposition rate for each of a plurality of features of the part to be manufactured from the one or more material forms, wherein the one or more material forms is a wire or a powder;
determine a sequence of a plurality of sequences to manufacture the part based on the model of the part, the plurality of additive manufacturing processes, the determined one or more material forms, and the deposition rate of the one or more material forms for each of the plurality of features to be formed via the sequence;
determine a size of each of the plurality of features; and
control the plurality of additive manufacturing tools to manufacture the part according to the sequence, wherein the sequence includes controlling a first additive manufacturing tool of the plurality of additive manufacturing tools to manufacture features greater than a threshold size value, and controlling a second additive manufacturing tool of the plurality of additive manufacturing tools to manufacture features less than the threshold size value.

2. The system of claim 1, wherein the sequence comprises manufacturing each of the plurality of features of the part to be manufactured via one of the plurality of additive manufacturing processes.

3. The system of claim 1, wherein the plurality of additive manufacturing processes comprises at least two of gas metal arc welding, pulsed gas metal arc welding, reciprocating gas metal arc welding, gas tungsten arc welding, submerged arc welding, plasma arc welding, and laser welding.

4. The system of claim 1, wherein the sequence comprises causing the processing circuit to:
control the first additive manufacturing tool to perform a first process to manufacture a first feature of the part to be manufactured; and
control the second additive manufacturing tool to perform a second process to manufacture a second feature of the part to be manufactured.

5. The system of claim 1, wherein the sequence comprises causing the processing circuit to:
control the first additive manufacturing tool to perform a first process to manufacture a first feature of the part to be manufactured based on a determination the one or more material forms is a wire; and
control the second additive manufacturing tool to perform a second process to manufacture a second feature of the part to be manufactured based on a determination the one or more material forms is a powder.

6. The system of claim 1, further comprising a motion system configured to:
move at least one of the first part to be manufactured relative to the plurality of additive manufacturing tools; or
move the plurality of additive manufacturing tools relative to the first part to be manufactured.

7. The system of claim 6, wherein the instructions further cause the processing circuit to receive information indicating abilities of the motion system, and wherein the sequence is determined in part based on the abilities of the motion system.

8. The system of claim 6, wherein the motion system is configured to adjust a position or orientation of the part to be manufactured.

9. The system of claim 8, wherein the sequence comprises causing the processing circuit to:
control the first additive manufacturing tool to perform a first process to manufacture a first feature of a plurality of features of the part to be manufactured;
control the motion system to adjust at least one of the position or the orientation of the part to be manufactured after manufacturing the first feature; and
control the second additive manufacturing tool to perform a second process to manufacture a second feature of the plurality of features of the part to be manufactured.

10. The system of claim 1, wherein the part to be manufactured is manufactured onto an existing part.

11. The system of claim 1, wherein the instructions further cause the processing circuit to receive information indicating a cost of each of the plurality of additive manufacturing processes, and wherein the sequence is determined in part based on the cost of each of the plurality of additive manufacturing processes.

12. A method of manufacturing a part, comprising:
receiving a three-dimensional model of a first part to be manufactured by an additive manufacturing system, the additive manufacturing system comprising a plurality of additive manufacturing tools configured to perform a plurality of additive manufacturing processes;
receiving information indicating the plurality of additive manufacturing processes the plurality of additive manufacturing tools are configured to perform;
determining one or more material forms to be added to the part, and a deposition rate required for each of a plurality of features of the first part to be manufactured from the one or more material forms;
determining a sequence to manufacture the part based on the three-dimensional model, the plurality of additive manufacturing processes, the determined one or more material forms, and the deposition rate of the one or more material forms for each of the plurality of features;
determining a size of each of the plurality of features; and
manufacturing the first part according to the sequence, wherein the sequence includes controlling a first additive manufacturing tool of the plurality of additive manufacturing tools to manufacture features greater than a threshold size value, and controlling a second additive manufacturing tool of the plurality of additive manufacturing tools to manufacture features less than the threshold size value.

13. The method of claim 12, wherein the sequence comprises manufacturing each of a plurality of features of the first part via one of the available additive manufacturing processes.

14. The method of claim 12, wherein the sequence comprises:
controlling the first additive manufacturing tool to perform a first process to manufacture a first feature of a plurality of features of the part to be manufactured with wire; and
controlling the second additive manufacturing tool to perform a second process to manufacture a second feature of the plurality of features of the part to be manufactured with powder.

15. The method of claim 14, wherein the first additive manufacturing tool is an arc welding torch, and the second additive manufacturing tool is a laser welding system.

16. The method of claim 12, wherein the additive manufacturing system comprises a motion system configured to adjust a position or orientation of the part to be manufactured, and wherein the sequence comprises:
controlling the first additive manufacturing tool to perform a first process to manufacture a first feature of a plurality of features of the part to be manufactured;
adjusting at least one of the position or the orientation of the part to be manufactured after manufacturing the first feature; and
controlling the second additive manufacturing tool to perform a second process to manufacture a second feature of the plurality of features of the part to be manufactured.

17. The method of claim 12, wherein the part to be manufactured is formed onto an existing part.

18. The method of claim 12, further comprising receiving information indicating a cost of each of the plurality of additive manufacturing processes, and wherein the sequence is determined in part based on the cost of each of the available additive manufacturing processes.

19. A system for planning a manufacturing process to be performed by an additive manufacturing system, the system for planning the manufacturing process comprising:
a processing circuit; and
a machine readable storage device comprising machine readable instructions which, when executed, cause the processing circuit to:
receive a three-dimensional model of a first part to be manufactured by the additive manufacturing system;
receive information indicating a selection of available additive manufacturing processes of the additive manufacturing system;
determine one or more material forms for each of a plurality of features of the part to be manufactured from the one or more material forms, wherein the one or more material forms is a metallic wire or a powder;
receive information indicating abilities of a motion system of the additive manufacturing system; and
determine a sequence of a plurality of sequences to manufacture the first part based on the three-dimensional model of the part, the abilities of the motion system, the determined one or more material forms for each of the plurality of features of the part, and the available additive manufacturing processes;

determine a size of each of the plurality of features; and control the additive manufacturing system to manufacture the first part based on the sequence, wherein the sequence includes controlling a first additive manufacturing tool of the plurality of additive manufacturing tools to manufacture features greater than a threshold size value by depositing a first material of the one or more material forms, and controlling a second additive manufacturing tool of the plurality of additive manufacturing tools to manufacture features less than the threshold size value by depositing a second material of the one or more material forms.

\* \* \* \* \*